US012591022B2

(12) United States Patent
Lei

(10) Patent No.: US 12,591,022 B2
(45) Date of Patent: Mar. 31, 2026

(54) MULTIFUNCTIONAL LINE FINDER FOR MINIATURE CIRCUIT BREAKER

(71) Applicant: Yongzhou Noyafa Electronic Co., Ltd., Yongzhou (CN)

(72) Inventor: Ming Lei, Yongzhou (CN)

(73) Assignee: Yongzhou Noyafa Electronic Co., Ltd., Yongzhou (CN)

( * ) Notice: Subject to any disclaimer, the term of this patent is extended or adjusted under 35 U.S.C. 154(b) by 149 days.

(21) Appl. No.: 18/732,659

(22) Filed: Jun. 4, 2024

(65) Prior Publication Data

US 2025/0076411 A1     Mar. 6, 2025

(30) Foreign Application Priority Data

Aug. 31, 2023     (CN) .......................... 202322366472.6

(51) Int. Cl.
*G01R 31/58*          (2020.01)
*G01V 3/08*           (2006.01)
(52) U.S. Cl.
CPC .............. *G01R 31/58* (2020.01); *G01V 3/08* (2013.01)
(58) Field of Classification Search
CPC .... G01R 31/58; G01R 31/3277; G01R 31/67; G01R 19/145; G01V 3/08
See application file for complete search history.

(56) References Cited

U.S. PATENT DOCUMENTS

| | | | |
|---|---|---|---|
| 2011/0032111 A1 | 2/2011 | Gallavan | |
| 2013/0100718 A1* | 4/2013 | Liu .......................... | H02M 1/36 |
| | | | 363/49 |
| 2018/0313898 A1* | 11/2018 | Zhang ..................... | G01R 31/36 |
| 2018/0323603 A1* | 11/2018 | Flourens ................. | H02H 5/10 |
| 2019/0097412 A1* | 3/2019 | Li .......................... | G01R 31/52 |

FOREIGN PATENT DOCUMENTS

| | | | | |
|---|---|---|---|---|
| CN | 214540074 U | 10/2021 | | |
| CN | 114646903 | * 6/2022 | ............. | G01R 31/58 |
| CN | 114646903 A | 6/2022 | | |

OTHER PUBLICATIONS

European Search Report of European Patent Application No. 24189345.2 issued on Jan. 8, 2025.

* cited by examiner

*Primary Examiner* — Alvaro E Fortich

(57)          ABSTRACT

A multifunctional line finder for miniature circuit breaker includes an emitter and a receiver, in which the emitter includes an emitting module for emitting line-finding signal and an LNG line-order detection module, the emitting module includes a main control unit, a strong electricity line-finding emitting unit, and a network line-finding emitting unit, the receiver includes a receiving module, an operational amplifier module, a signal processing module, and an audio drive module, a line-finding signal output end of the emitting module is connected to a line-finding signal input end of the receiving module, a signal detecting output end of the LNG line-order detection module is connected to a signal detecting input end of the receiving module, a signal receiving output end of the receiving module is connected to a signal receiving input end of the operational amplifier module.

10 Claims, 9 Drawing Sheets

REF        R47
           6.8K

R48 100K

8V_NCV

8V_K

R31
100K

C19
330NF 100V

R32
100K

C18
150NF 100V

L2
680UH

MULTIFUNCTIONAL LINE FINDER FOR MINIATURE CIRCUIT BREAKER

CROSS REFERENCE TO RELATED APPLICATIONS

The present application claims the benefit of Chinese Patent Application No. 202322366472.6 filed on Aug. 31, 2023, the contents of which are incorporated herein by reference in their entirety.

FIELD

The present disclosure relates to a line finder and, particularly, a multifunctional line finder for miniature circuit breaker.

BACKGROUND

In daily life, the most common application of electrical wiring testing includes such as live wire, neutral wire, earth wire of the socket, wiring, and each load device on the socket corresponding to the miniature circuit breaker (referred to as the MCB) controlling it. Under the technical conditions of the prior art, the electrician judging the wiring order of a socket is mainly detected by manually disassembling the socket for inspection, and a detection of electrical appliances controlled by miniature circuit breaker is mainly by cutting off the switch to exclude the inaccessible loads.

The line finder of the prior art provides only a single function, which generally only provides a specific line-finding function, and it is difficult to be applied to a variety of scenarios in use. Therefore, there is an urgent necessity for the development of a device that provides a variety of line-finding functions and enables a wiring sequence inspection of sockets in order to solve the problem of the existing line finder with only a single function.

SUMMARY

In view of the aforementioned problem of the prior art of line finder with only a single function, provided in the present disclosure is a multifunctional line finder for miniature circuit breaker, which may achieve a variety of line-finding functions such as strong electricity line finding, and network line finding by including an LNG (Live-Neutral-Ground) line-order detection module, a strong electricity line-finding emitting unit, and a network line-finding emitting unit, and may carry out a line-order inspection of a socket, so that the multifunctional line finder for miniature circuit breaker may be applied to a variety of scenarios, thereby improving the efficiency of line finding.

The technical solutions adopted by the present disclosure to solve the technical problems are as follows. A multifunctional line finder for miniature circuit breaker includes an emitter and a receiver, in which the emitter includes an emitting module for emitting line-finding signal and an LNG line-order detection module, the emitting module includes a main control unit, a strong electricity line-finding emitting unit, and a network line-finding emitting unit, a first control signal output end of the main control unit is connected to a control signal input end of the strong electricity line-finding emitting unit, a second control signal output end of the main control unit is connected to a control signal input end of the network line-finding emitting unit, the receiver includes a receiving module, an operational amplifier module, a signal processing module, and an audio drive module, a line-finding signal output end of the emitting module is connected to a line-finding signal input end of the receiving module, a signal detecting output end of the LNG line-order detection module is connected to a signal detecting input end of the receiving module, a signal receiving output end of the receiving module is connected to a signal receiving input end of the operational amplifier module, a signal amplifying output end of the operational amplifier module is connected to a signal amplifying input end of the signal processing module, and a signal controlling output end of the signal processing module is connected to a signal controlling input end of the audio drive module; and the line finder further includes a power supply module for supply power.

Further, the strong electricity line-finding emitting unit comprises a first switch transistor Q1, a second switch transistor Q4, a third switch transistor Q8, and a transformer T1, a first power output end of the power supply module is connected to a first input end of the transformer T1, a second input end of the transformer T1 is connected to a conductive input end of the first switch transistor Q1, the first control signal output end of the main control unit is connected to a control conductive end of the first switch transistor Q1, a conductive output end of the first switch transistor Q1 is grounded, the first power output end of the power supply module is further connected to a control conductive end of the second switch transistor Q4 and the third switch transistor Q8, the first power output end of the power supply module is connected to a conductive input end of the second switch transistor Q4, a conductive output end of the second switch transistor Q4 is connected to a conductive input end of the third switch transistor Q8, and a conductive output end of the third switch transistor Q8 is grounded.

Further, the network line-finding emitting unit comprises a fourth switch transistor Q5, a fifth switch transistor Q6, a sixth switch transistor Q7, and an emitting chip U7, a second power output end of the power supply module is connected to a power input end of the emitting chip U7, the second power output end of the power supply module is further connected to a conductive input end of the fourth switch transistor Q5, a conductive output end of the fourth switch transistor Q5 is grounded, an A4 port of the emitting chip U7 is connected to a control conductive end of the fourth switch transistor Q5, a second control signal output end of the main control unit is connected to a control conductive end of the fifth switch transistor Q6, a conductive input end of the fifth switch transistor Q6 is connected to a control conductive end of the fourth switch transistor Q5, a conductive output end of the fifth switch transistor Q6 is grounded, the second control signal output end of the main control unit is further connected to a control conductive end of the sixth switch transistor Q7, an OE3 port of the emitting chip U7 is connected to a conductive input end of the sixth switch transistor Q7, and a conductive output end of the sixth switch transistor Q7 is grounded.

Further, the LNG line-order detection module comprises a safety protection unit, a power socket line-order detection unit and a signal generation oscillation unit; the power socket line-order detection unit and the signal generation oscillation unit are connected to the safety protection unit respectively.

Further, the safety protection unit comprises a connector J7, a diode D3, a diode D4, a diode D6, a diode D7, a resistor R9, and a resistor R10, a live wire port of the connector J7 is connected in series with the diode D3, the diode D6, and the resistor R9, the diode D3 is provided in a reverse direction to the diode D6, a neutral wire port of the connector J7 is connected in series with the diode D4, the diode D7, and the resistor R10, and the diode D4 is provided in a reverse direction to the diode D7.

Further, the signal generation oscillation unit comprises a trigger diode Q2, diode D5, diode D8, a capacitor C29, a capacitor C30, a resistor R11, and a resistor R36, a positive pole of the diode D5 is connected to a live wire end L, a negative pole of the diode D5 is connected to an end of the capacitor C29, a positive pole of the diode D8 is connected to a neutral wire end N, a negative pole of the diode D8 is connected to an opposite end of the capacitor C29, an end of the trigger diode Q2 is connected to the neutral wire end N, an opposite end of the trigger diode Q2 is connected to an end of the resistor R36, an opposite end of the resistor R36 is connected to a negative pole of the diode D5, the capacitor C30 and the resistor R36 are connected in parallel, and the resistor R11 and the capacitor C29 are connected in parallel.

Further, the power socket line-order detection unit comprises a light-emitting diode LED1, a light-emitting diode LED2, and a light-emitting diode LED3, the light-emitting diode LED2 is connected in series between a live wire end L and a neutral wire end N, the light-emitting diode LED1 is connected in series between the live wire end L and an earth end G, the light-emitting diode LED3 is connected in series between the live wire end L and the earth end G.

Further, the receiving module comprises an NCV probe receiving unit for receiving line-finding signal and a miniature circuit breaker line-finding LC probe receiving unit for receiving detection signal, a line-finding signal output end of the emitting module is connected to a line-finding signal input end of the NCV probe receiving unit, and a detection signal output end of the LNG line-order detection module is connected to a detection signal input end of the miniature circuit breaker line-finding LC probe receiving unit.

Further, the operational amplifier module comprises a miniature circuit breaker line-finding amplifier unit for amplifying a detection signal, and a detection signal output end of the miniature circuit breaker line-finding LC probe receiving unit is connected to a detection signal input end of the miniature circuit breaker line-finding amplifier unit.

Further, the audio drive module comprises an operational amplifier U7 and a power amplifier U1, a data output end of the signal processing module is connected to an inverting input end of the operational amplifier U7, a capacitor C44, a resistor R17, and a resistor R19 are connected in series between the data output end of the signal processing module and the inverting input end of the operational amplifier U7, a capacitor C2 is connected between ground and a common end of the resistor R17 and the resistor R19, a resistor R56 is connected between an output end of the operational amplifier U7 and the common end of the resistor R17 and the resistor R19, a capacitor C41 is connected between the inverting input end of the operational amplifier U7 and the output end of the operational amplifier U7, a non-inverting input end of the operational amplifier U7 is connected to a reference power supply, the output end of the operational amplifier U7 is connected to an input end of the power amplifier U1, an output end of the power amplifier U1 is connected to a speaker P1, and a capacitor C42 and a resistor R57 are connected in series between the output end of the operational amplifier U7 and the input end of the power amplifier U1.

The beneficial effects of the present disclosure: Provided in the present disclosure is a multifunctional line finder for miniature circuit breaker, which may achieve a variety of line-finding functions such as strong electricity line finding, and network line finding by including an LNG line-order detection module, a strong electricity line-finding emitting unit, and a network line-finding emitting unit, and may carry out a line-order inspection of a socket, so that the multifunctional line finder for miniature circuit breaker may be applied to a variety of scenarios, thereby improving the efficiency of line finding.

DETAILED DESCRIPTION OF THE EMBODIMENTS

To enable the purpose, technical solutions and effects of the present disclosure to be clearer and more explicit, the present disclosure is hereinafter described in further detail with reference to the accompanying drawings and by means of embodiments. It should be understood that the specific embodiments described herein are for the sole purpose of explaining the present disclosure and are not intended to limit the present disclosure.

Figures 1, 2:
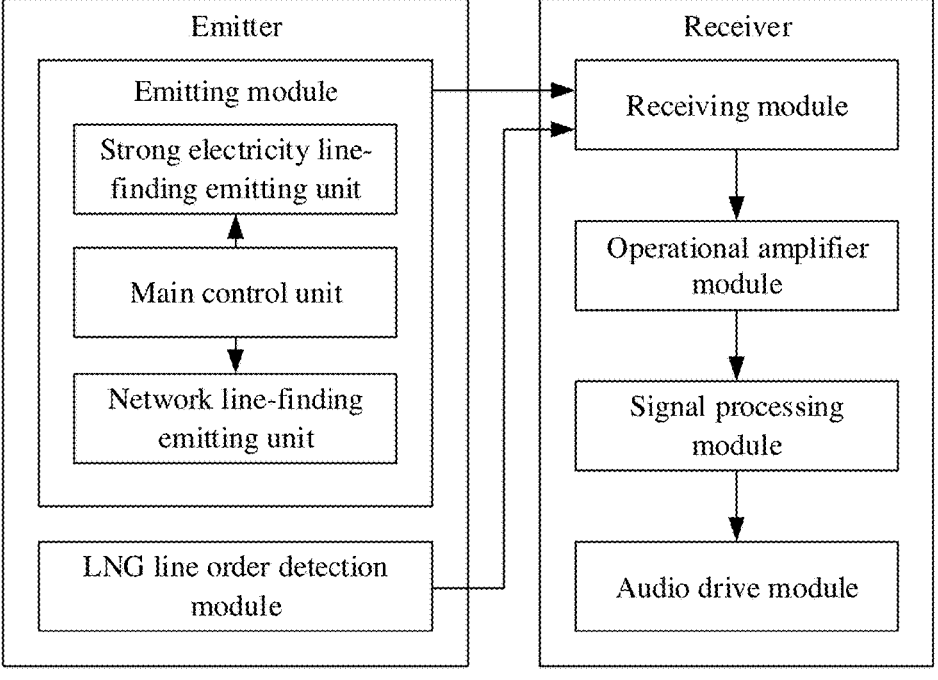
FIG. 1 is a circuit block diagram of a multifunctional line finder for miniature circuit breaker provided in the present disclosure.
FIG. 2 is a circuit block diagram of the LNG line-order detection module provided in the present disclosure.
Figure 3:
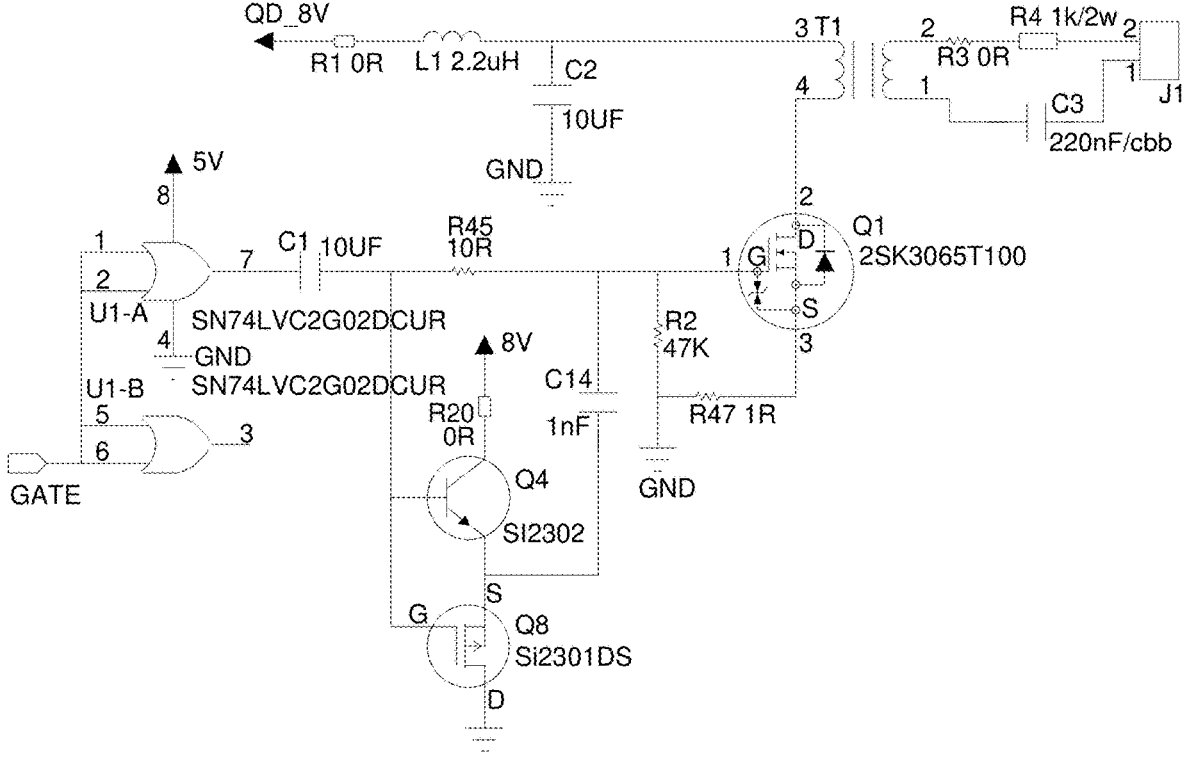
FIG. 3 is a circuit diagram of the strong electricity line-finding emitting unit provided in the present disclosure.
Figure 4:
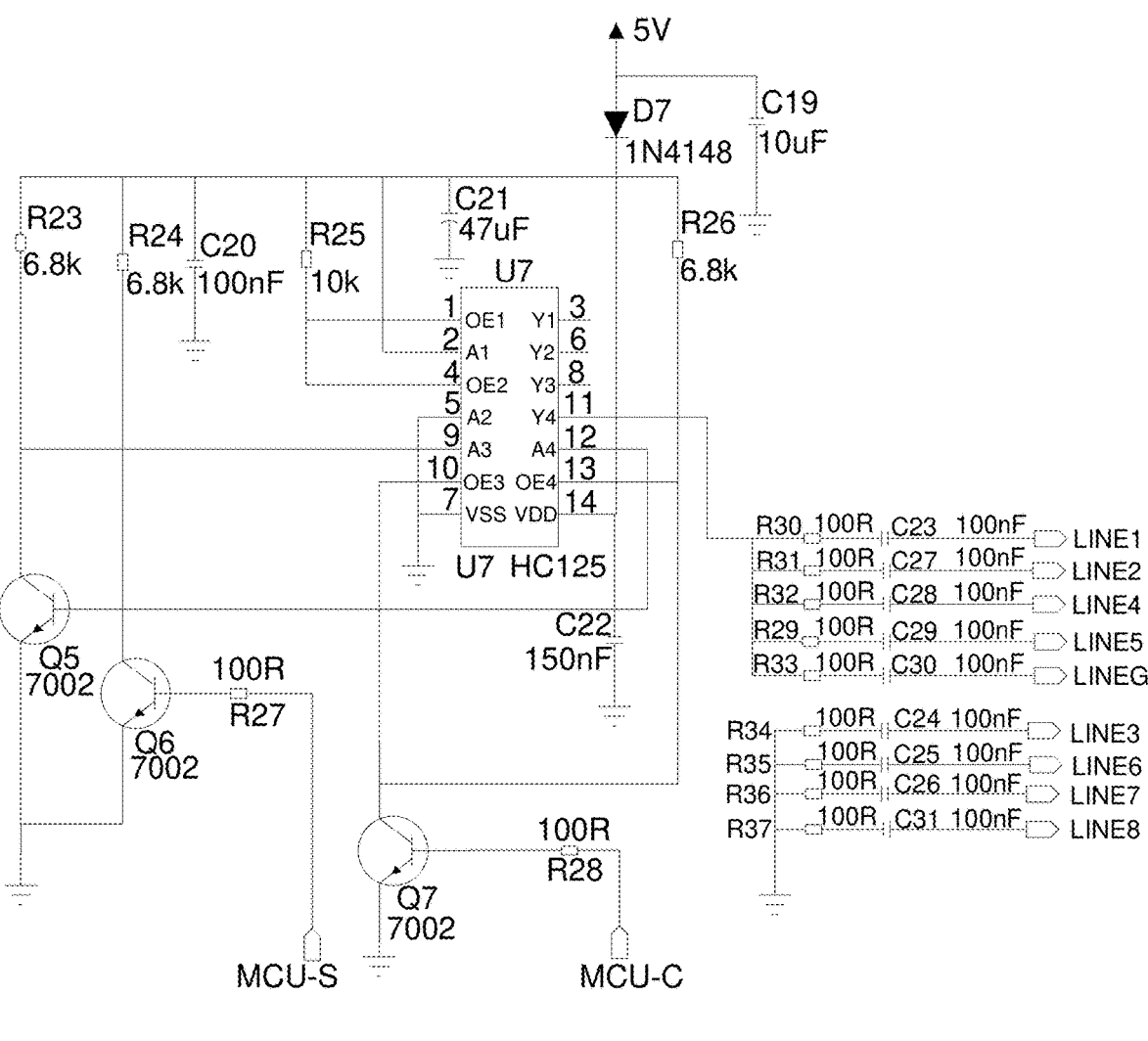
FIG. 4 is a circuit diagram of the network line-finding emitting unit provided in the present disclosure.
Figure 5:
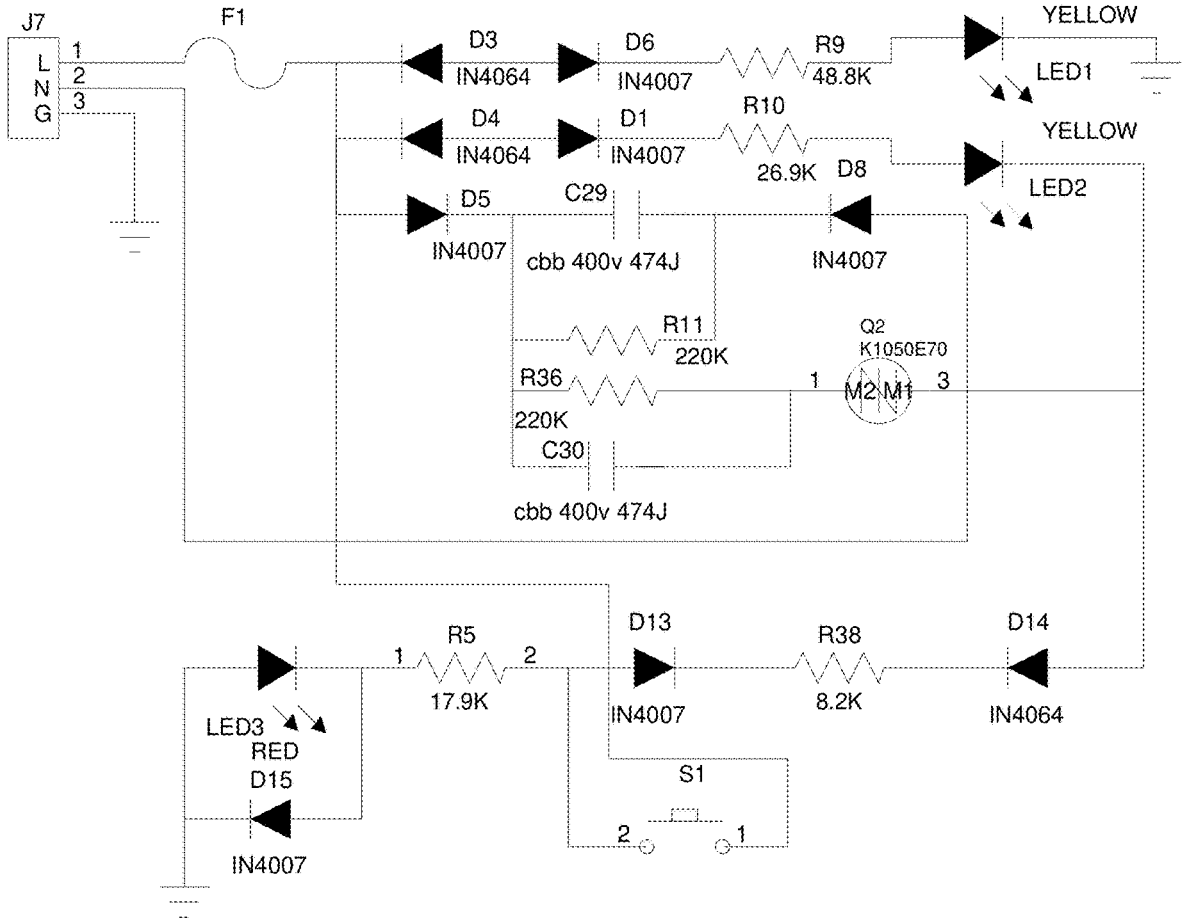
FIG. 5 is a circuit diagram of the line-order detection module provided in the present disclosure.
Figure 6:
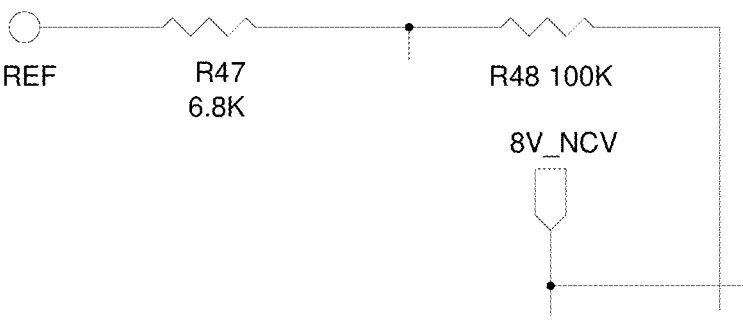
FIG. 6 is a circuit diagram of the NCV probe receiving unit provided in the present disclosure.
Figure 7:
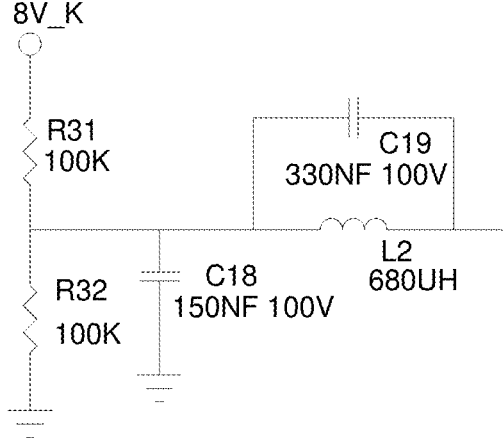
FIG. 7 is a circuit diagram of the miniature circuit breaker line-finding LC probe receiving unit provided in the present disclosure.
Figure 8:
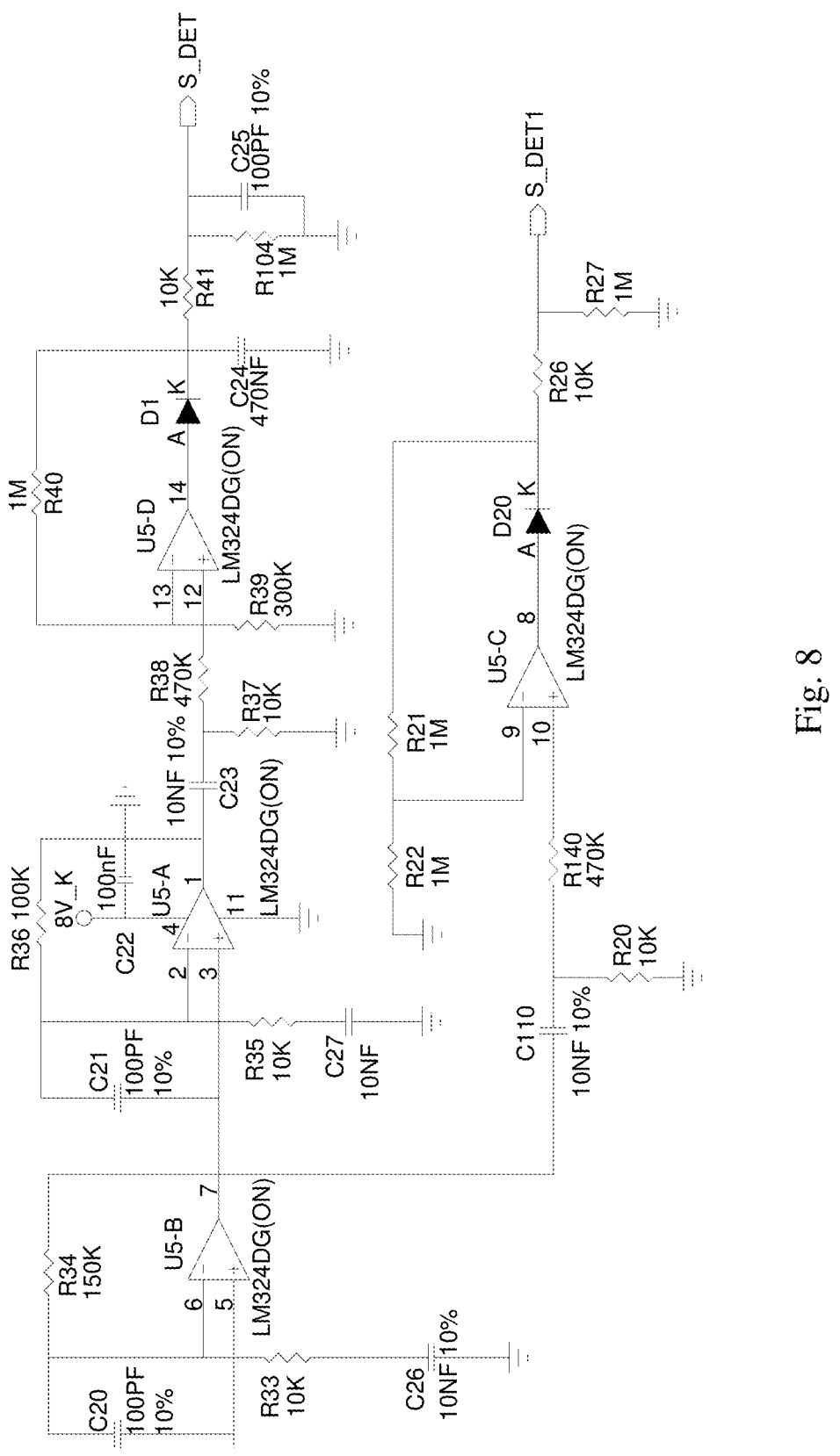
FIG. 8 is a circuit diagram of the miniature circuit breaker line-finding amplifier unit provided in the present disclosure.
Figure 9:
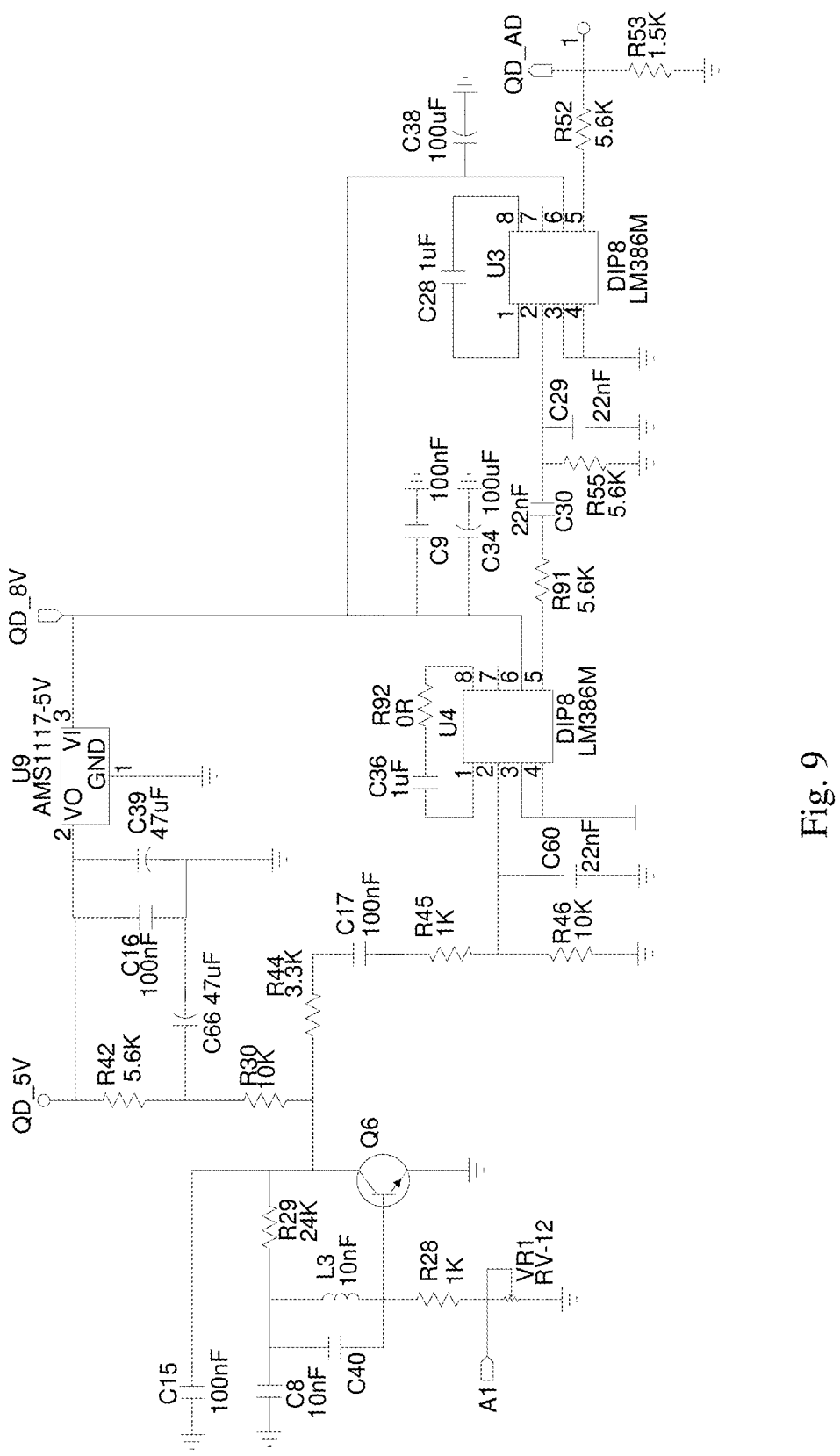
FIG. 9 is a circuit diagram of strong electricity and network line-finding amplifier unit provided in the present disclosure.
Figure 10:
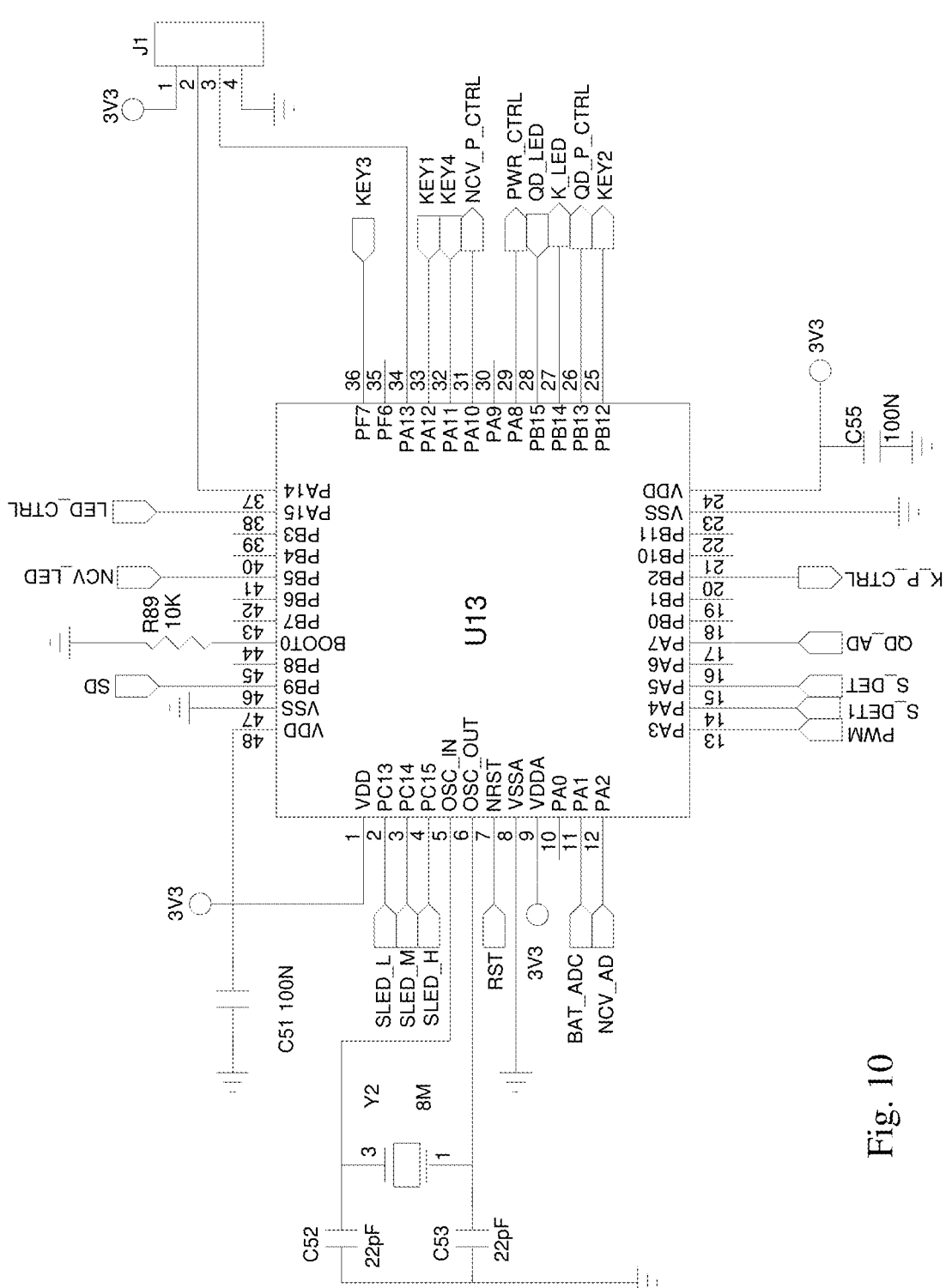
FIG. 10 is a circuit diagram of the signal processing module provided in the present disclosure.
Figure 11:
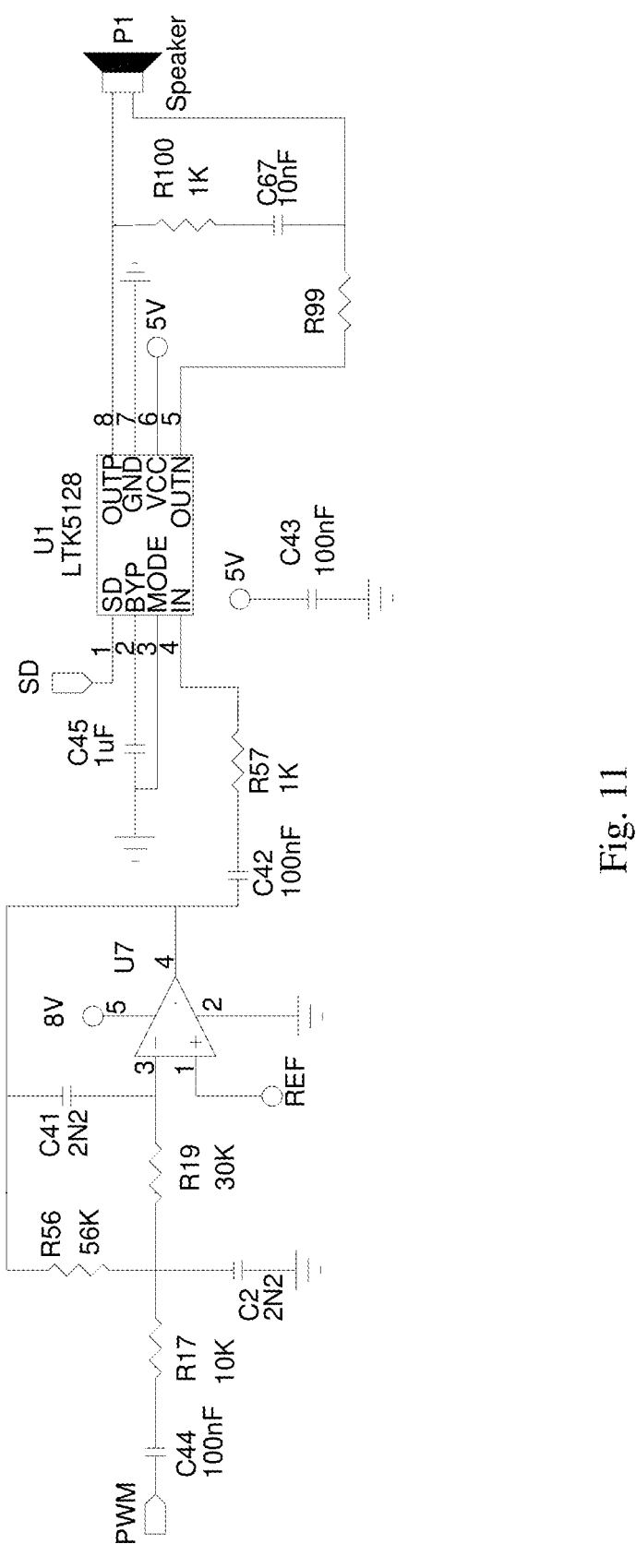
FIG. 11 is a circuit diagram of the audio drive module provided in the present disclosure.

Referring to FIGS. 1-11, provided in the present disclosure is a multifunctional line finder for miniature circuit breaker.

In the present embodiment, a multifunctional line finder for miniature circuit breaker includes an emitter and a receiver, in which the emitter comprises an emitting module for emitting line-finding signal and an LNG line-order detection module, the emitting module includes a main control unit, a strong electricity line-finding emitting unit, and a network line-finding emitting unit, a first control signal output end of the main control unit is connected to a control signal input end of the strong electricity line-finding emitting unit, a second control signal output end of the main control unit is connected to a control signal input end of the network line-finding emitting unit, the receiver includes a receiving module, an operational amplifier module, a signal processing module, and an audio drive module, a line-finding signal output end of the emitting module is connected to a line-finding signal input end of the receiving module, a signal detecting output end of the LNG line-order detection module is connected to a signal detecting input end of the receiving module, a signal receiving output end of the receiving module is connected to a signal receiving input end of the operational amplifier module, a signal amplifying output end of the operational amplifier module is connected to a signal amplifying input end of the signal processing module, and a signal controlling output end of the signal processing module is connected to a signal controlling input end of the audio drive module; and the line finder further includes a power supply module for supply power. In the present embodiment, a microcontroller is selected for the signal processing module, and various types of microcontrollers of the prior art may achieve such function, so there is no limitation on the type of microcontroller in the present disclosure, and commercially available microcontrollers will do. The power supply module adopts a lithium battery output after a voltage regulator module for power supply, and the voltage regulator module may adopt a conventional voltage regulator module.

In the present embodiment, the strong electricity line-finding emitting unit includes a first switch transistor Q1, a second switch transistor Q4, a third switch transistor Q8, and a transformer T1, a first power output end of the power supply module is connected to a first input end of the transformer T1, a second input end of the transformer T1 is connected to a conductive input end of the first switch transistor Q1, the first control signal output end of the main control unit is connected to a control conductive end of the first switch transistor Q1, a conductive output end of the first switch transistor Q1 is grounded, the first power output end of the power supply module is further connected to a control conductive end of the second switch transistor Q4 and the third switch transistor Q8, the first power output end of the power supply module is connected to a conductive input end of the second switch transistor Q4, a conductive output end of the second switch transistor Q4 is connected to a conductive input end of the third switch transistor Q8, and a conductive output end of the third switch transistor Q8 is grounded. In the present embodiment, by controlling the on-off of the first switch transistor Q1, the second switch transistor Q4, the third switch transistor Q8 through the main control unit, an alternating signal is generated in the transformer T1, which consequently emits a strong electricity line-finding signal.

In the present embodiment, the network line-finding emitting unit comprises a fourth switch transistor Q5, a fifth switch transistor Q6, a sixth switch transistor Q7, and an emitting chip U7, a second power output end of the power supply module is connected to a power input end of the emitting chip U7, the second power output end of the power supply module is further connected to a conductive input end of the fourth switch transistor Q5, a conductive output end of the fourth switch transistor Q5 is grounded, an A4 port of the emitting chip U7 is connected to a control conductive end of the fourth switch transistor Q5, a second control signal output end of the main control unit is connected to a control conductive end of the fifth switch transistor Q6, a conductive input end of the fifth switch transistor Q6 is connected to a control conductive end of the fourth switch transistor Q5, a conductive output end of the fifth switch transistor Q6 is grounded, the second control signal output end of the main control unit is further connected to a control conductive end of the sixth switch transistor Q7, an OE3 port of the emitting chip U7 is connected to a conductive input end of the sixth switch transistor Q7, and a conductive output end of the sixth switch transistor Q7 is grounded. In the present embodiment, the main control unit controls a high or low level of the fourth switch transistor Q5, the fifth switch transistor Q6, and the sixth switch transistor Q7, which consequently emits a network line-finding signal via chip U7.

In the present embodiment, the LNG line-order detection module comprises a safety protection unit, a power socket line-order detection unit and a signal generation oscillation unit; the power socket line-order detection unit and the signal generation oscillation unit are connected to the safety protection unit respectively.

In the present embodiment, the safety protection unit comprises a connector J7, a diode D3, a diode D4, a diode D6, a diode D7, a resistor R9, and a resistor R10, a live wire port of the connector J7 is connected in series with the diode D3, the diode D6, and the resistor R9, the diode D3 is provided in a reverse direction to the diode D6, a neutral wire port of the connector J7 is connected in series with the diode D4, the diode D7, and the resistor R10, and the diode D4 is provided in a reverse direction to the diode D7. The safety protection unit is provided to suppress the electromagnetic noise and clutter signal of the input power supply to prevent interference with the power supply, and also to prevent the high-frequency clutter generated by the power supply itself from interfering with the power grid. In the present embodiment, fuse F1 is connected in series on the live wire port for overcurrent protection.

In the present embodiment, the signal generation oscillation unit comprises a trigger diode Q2, diode D5, diode D8, a capacitor C29, a capacitor C30, a resistor R11, and a resistor R36, a positive pole of the diode D5 is connected to a live wire end L, a negative pole of the diode D5 is connected to an end of the capacitor C29, a positive pole of the diode D8 is connected to a neutral wire end N, a negative pole of the diode D8 is connected to an opposite end of the capacitor C29, an end of the trigger diode Q2 is connected to the neutral wire end N, an opposite end of the trigger diode Q2 is connected to an end of the resistor R36, an opposite end of the resistor R36 is connected to a negative pole of the diode D5, the capacitor C30 and the resistor R36 are connected in parallel, and the resistor R11 and the capacitor C29 are connected in parallel.

In the present embodiment, when the 220 V alternating current is in a positive half-cycle, the power supply charges capacitor C29 through resistor R36 and trigger diode Q2, thereby forming a high-frequency oscillating pulse in the loop of the live wire end L and the neutral wire end N. When the alternating current is in the negative half-cycle, the power supply forms a high-frequency oscillating pulse through the diode D8, resistor R11, capacitor C30 and trigger diode Q2 to form a circuit, so both positive and negative half-cycles may produce high-frequency trigger pulse signals.

In the present embodiment, the power socket line-order detection unit comprises a light-emitting diode LED1, a light-emitting diode LED2, and a light-emitting diode LED3, the light-emitting diode LED2 is connected in series between the live wire end L and the neutral wire end N, the light-emitting diode LED1 is connected in series between the live wire end L and an earth end G, the light-emitting diode LED3 is connected in series between the live wire end L and the earth end G. The power socket line-order detection unit consists of three LEDs and indicates different detected problems by displaying them in form of a combination of the three LEDs.

In the present embodiment, the receiving module includes an NCV probe receiving unit for receiving line-finding signal and a miniature circuit breaker line-finding LC probe receiving unit for receiving detection signal, a line-finding signal output end of the emitting module is connected to a line-finding signal input end of the NCV probe receiving unit, and a detection signal output end of the LNG line-order detection module is connected to a detection signal input end of the miniature circuit breaker line-finding LC probe receiving unit.

In the present embodiment, the operational amplifier module includes a miniature circuit breaker line-finding amplifier unit for amplifying a detection signal, and a detection signal output end of the miniature circuit breaker line-finding LC probe receiving unit is connected to a detection signal input end of the miniature circuit breaker line-finding amplifier unit.

In the present embodiment, the operational amplifier module further includes a NCV amplifier unit for amplifying a line-finding signal, and a detection signal output end of the NCV probe receiving unit is connected to a detection signal input end of the NCV amplifier unit.

In the present embodiment, the multifunctional line finder for miniature circuit breaker further includes a strong electricity and network line-finding LC probe for receiving a strong electricity and network line-finding signal, and a strong electricity and network amplifier unit for amplifying a line-finding signal, in which a strong electricity and network line-finding signal output end of the strong electricity and network line-finding LC probe is connected to a line-finding signal input end of the strong electricity and network line-finding unit.

In the present embodiment, the audio drive module comprises an operational amplifier U7 and a power amplifier U1, a data output end of the signal processing module is connected to an inverting input end of the operational amplifier U7, a capacitor C44, a resistor R17, and a resistor R19 are connected in series between the data output end of the signal processing module and the inverting input end of the operational amplifier U7, a capacitor C2 is connected between ground and a common end of the resistor R17 and the resistor R19, a resistor R56 is connected between an output end of the operational amplifier U7 and the common end of the resistor R17 and the resistor R19, a capacitor C41 is connected between the inverting input end of the operational amplifier U7 and the output end of the operational amplifier U7, a non-inverting input end of the operational amplifier U7 is connected to a reference power supply, the output end of the operational amplifier U7 is connected to an input end of the power amplifier U1, an output end of the power amplifier U1 is connected to a speaker P1, and a capacitor C42 and a resistor R57 are connected in series between the output end of the operational amplifier U7 and the input end of the power amplifier U1.

In the present embodiment, the output end of the operational amplifier U7 is connected to an input end of the power amplifier U1, an output end of the power amplifier U1 is connected to a speaker P1, the speaker P1 is directly driven the power amplifier U1 to produce sound, and a capacitor C42 and a resistor R57 are connected in series between the output end of the operational amplifier U7 and the input end of the power amplifier U1. The signal processing module outputs a certain frequency (The frequency may be set freely) of PWM signal to the operational amplifier U7, the operational amplifier U7 constitutes a prior voltage amplifier circuit, in which the signal is amplified by the operational amplifier U7 and outputs to the power amplifier U1, and the power amplifier U1 drives the speaker to produce the sound.

In the present embodiment, a multifunctional line finder for miniature circuit breaker achieves a variety of line-finding functions such as strong electricity line finding, and finding functions such as strong electricity line finding, and network line finding by including an LNG line-order detection module, a strong electricity line-finding emitting unit, and a network line-finding emitting unit, and may carry out a line-order inspection of a socket, so that the multifunctional line finder for miniature circuit breaker may be applied to a variety of scenarios, thereby improving the efficiency of line finding.

It should be understood that the application of the present disclosure is not limited to the aforementioned examples, but may be improved or modified in accordance with the above description to those skilled in the art, and all of these improvements and modifications shall fall within the scope of protection of the appended claims of the present disclosure.

The invention claimed is:

1. A multifunctional line finder for miniature circuit breaker, comprising an emitter and a receiver, wherein the emitter comprises an emitting module for emitting line-finding signal and an LNG (Live-Neutral-Ground) line-order detection module, the emitting module comprises a main control unit, a strong electricity line-finding emitting unit, and a network line-finding emitting unit, a first control signal output end of the main control unit is connected to a control signal input end of the strong electricity line-finding emitting unit, and a second control signal output end of the main control unit is connected to a control signal input end of the network line-finding emitting unit; wherein the receiver comprises a receiving module, an operational amplifier module, a signal processing module, and an audio drive module, a line-finding signal output end of the emitting module is connected to a line-finding signal input end of the receiving module, a signal detecting output end of the LNG line-order detection module is connected to a signal detecting input end of the receiving module, a signal receiving output end of the receiving module is connected to a signal receiving input end of the operational amplifier module, a signal amplifying output end of the operational amplifier module is connected to a signal amplifying input end of the signal processing module, and a signal controlling output end of the signal processing module is connected to a signal controlling input end of the audio drive module; and the line finder further comprises a power supply module for supply power.

2. The multifunctional line finder for miniature circuit breaker according to claim 1, wherein the strong electricity line-finding emitting unit comprises a first switch transistor Q1, a second switch transistor Q4, a third switch transistor Q8, and a transformer T1, a first power output end of the power supply module is connected to a first input end of the transformer T1, a second input end of the transformer T1 is connected to a conductive input end of the first switch transistor Q1, the first control signal output end of the main control unit is connected to a control conductive end of the first switch transistor Q1, a conductive output end of the first switch transistor Q1 is grounded, the first power output end of the power supply module is further connected to a control conductive end of the second switch transistor Q4 and the third switch transistor Q8, the first power output end of the power supply module is connected to a conductive input end of the second switch transistor Q4, a conductive output end of the second switch transistor Q4 is connected to a conductive input end of the third switch transistor Q8, and a conductive output end of the third switch transistor Q8 is grounded.

3. The multifunctional line finder for miniature circuit breaker according to claim 1, wherein the network line-finding emitting unit comprises a fourth switch transistor Q5, a fifth switch transistor Q6, a sixth switch transistor Q7, and an emitting chip U7, a second power output end of the power supply module is connected to a power input end of the emitting chip U7, the second power output end of the power supply module is further connected to a conductive input end of the fourth switch transistor Q5, a conductive output end of the fourth switch transistor Q5 is grounded, an A4 port of the emitting chip U7 is connected to a control conductive end of the fourth switch transistor Q5, a second control signal output end of the main control unit is connected to a control conductive end of the fifth switch transistor Q6, a conductive input end of the fifth switch transistor Q6 is connected to a control conductive end of the fourth switch transistor Q5, a conductive output end of the fifth switch transistor Q6 is grounded, the second control signal output end of the main control unit is further connected to a control conductive end of the sixth switch transistor Q7, an OE3 port of the emitting chip U7 is connected to a conductive input end of the sixth switch transistor Q7, and a conductive output end of the sixth switch transistor Q7 is grounded.

4. The multifunctional line finder for miniature circuit breaker according to claim 1, wherein the LNG line-order detection module comprises a safety protection unit, a power socket line-order detection unit and a signal generation oscillation unit; the power socket line-order detection unit and the signal generation oscillation unit are connected to the safety protection unit respectively.

5. The multifunctional line finder for miniature circuit breaker according to claim 4, wherein the safety protection unit comprises a connector J7, a diode D3, a diode D4, a diode D6, a diode D7, a resistor R9, and a resistor R10, a live wire port of the connector J7 is connected in series with the diode D3, the diode D6, and the resistor R9, the diode D3 is provided in a reverse direction to the diode D6, a neutral wire port of the connector J7 is connected in series with the diode D4, the diode D7, and the resistor R10, and the diode D4 is provided in a reverse direction to the diode D7.

6. The multifunctional line finder for miniature circuit breaker according to claim 4, wherein the signal generation oscillation unit comprises a trigger diode Q2, diode D5, diode D8, a capacitor C29, a capacitor C30, a resistor R11, and a resistor R36, a positive pole of the diode D5 is connected to a live wire end L, a negative pole of the diode D5 is connected to an end of the capacitor C29, a positive pole of the diode D8 is connected to a neutral wire end N, a negative pole of the diode D8 is connected to an opposite end of the capacitor C29, an end of the trigger diode Q2 is connected to the neutral wire end N, an opposite end of the trigger diode Q2 is connected to an end of the resistor R36, an opposite end of the resistor R36 is connected to a negative pole of the diode D5, the capacitor C30 and the resistor R36 are connected in parallel, and the resistor R11 and the capacitor C29 are connected in parallel.

7. The multifunctional line finder for miniature circuit breaker according to claim 4, wherein the power socket line-order detection unit comprises a light-emitting diode LED1, a light-emitting diode LED2, and a light-emitting diode LED3, the light-emitting diode LED2 is connected in series between a live wire end L and a neutral wire end N, the light-emitting diode LED1 is connected in series between the live wire end L and an earth end G, the light-emitting diode LED3 is connected in series between the live wire end L and the earth end G.

8. The multifunctional line finder for miniature circuit breaker according to claim 1, wherein the receiving module comprises an NCV probe receiving unit for receiving line-finding signal and a miniature circuit breaker line-finding LC probe receiving unit for receiving detection signal, a line-finding signal output end of the emitting module is connected to a line-finding signal input end of the NCV probe receiving unit, and a detection signal output end of the LNG line-order detection module is connected to a detection signal input end of the miniature circuit breaker line-finding LC probe receiving unit.

9. The multifunctional line finder for miniature circuit breaker according to claim 8, wherein the operational amplifier module comprises a miniature circuit breaker line-finding amplifier unit for amplifying a detection signal, and a detection signal output end of the miniature circuit breaker line-finding LC probe receiving unit is connected to a detection signal input end of the miniature circuit breaker line-finding amplifier unit.

10. The multifunctional line finder for miniature circuit breaker according to claim 1, wherein the audio drive module comprises an operational amplifier U7 and a power amplifier U1, a data output end of the signal processing module is connected to an inverting input end of the operational amplifier U7, a capacitor C44, a resistor R17, and a resistor R19 are connected in series between the data output end of the signal processing module and the inverting input end of the operational amplifier U7, a capacitor C2 is connected between ground and a common end of the resistor R17 and the resistor R19, a resistor R56 is connected between an output end of the operational amplifier U7 and the common end of the resistor R17 and the resistor R19, a capacitor C41 is connected between the inverting input end of the operational amplifier U7 and the output end of the operational amplifier U7, a non-inverting input end of the operational amplifier U7 is connected to a reference power supply, the output end of the operational amplifier U7 is connected to an input end of the power amplifier U1, an output end of the power amplifier U1 is connected to a speaker P1, and a capacitor C42 and a resistor R57 are connected in series between the output end of the operational amplifier U7 and the input end of the power amplifier U1.

* * * * *